(12) United States Patent
Gardner et al.

(10) Patent No.: US 6,365,943 B1
(45) Date of Patent: Apr. 2, 2002

(54) HIGH DENSITY INTEGRATED CIRCUIT

(75) Inventors: Mark I. Gardner, Cedar Creek; Daniel Kadosh; Fred N. Hause, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/157,644

(22) Filed: Sep. 21, 1998

Related U.S. Application Data

(62) Division of application No. 08/844,975, filed on Apr. 23, 1997, now Pat. No. 5,851,883.

(51) Int. Cl.$^7$ .......................... H01L 29/76; H01L 29/94; H01L 27/01
(52) U.S. Cl. .................. 257/377; 257/382; 257/347
(58) Field of Search ................................ 257/369, 377, 257/382, 385, 347, 67, 74; 438/291, 152, 275, 300

(56) References Cited

U.S. PATENT DOCUMENTS

| | | | | |
|---|---|---|---|---|
| 4,489,478 A | * | 12/1984 | Sakurai | 257/347 |
| 5,168,072 A | | 12/1992 | Moslehi | 438/300 |
| 5,470,776 A | | 11/1995 | Ryou | 438/152 |
| 5,571,738 A | * | 11/1996 | Krivokapic | 438/291 |
| 5,612,552 A | * | 3/1997 | Owens | 257/347 |
| 5,670,402 A | | 9/1997 | Sogawa et al. | 438/275 |
| 5,801,424 A | * | 9/1998 | Luich | 257/377 |
| 5,945,698 A | * | 8/1999 | Prall | 257/377 |
| 6,025,635 A | * | 2/2000 | Krivokapic | 257/377 |

* cited by examiner

*Primary Examiner*—Steven Loke
(74) *Attorney, Agent, or Firm*—Kevin L. Daffer; Conley, Rose & Tayon P.C.

(57) ABSTRACT

A semiconductor transistor which includes a silicon base layer, a gate dielectric formed on the silicon base layer, first and second silicon source/drain structures, first and second spacer structures, and a silicon gate structure is provided. A method for forming the semiconductor transistor may include a semiconductor process in which a dielectric layer is formed on an upper surface of a semiconductor substrate which includes a silicon base layer. Thereafter, an upper silicon layer is formed on an upper surface of the dielectric layer. The dielectric layer and the upper silicon layer are then patterned to form first and second silicon-dielectric stacks on the upper surface of the base silicon layer. The first and second silicon-dielectric stacks are laterally displaced on either side of a channel region of the silicon substrate and each include a proximal sidewall and a distal sidewall. The proximal sidewalls are approximately coincident with respective boundaries of the channel region. Thereafter, proximal and distal spacer structures are formed on the proximal and distal sidewalls respectively of the first and second silicon-dielectric stacks. A gate dielectric layer is then formed on exposed portions of the silicon base layer over a channel region of the base silicon layer. Portions of the first and second silicon-dielectric stacks located over respective source/drain regions of the base silicon layer are then selectively removed. Silicon is then deposited to fill first and second voids created by the selected removal of the stacks. The silicon deposition also fills a silicon gate region above the gate dielectric over the channel region. Thereafter, an impurity distribution is introduced into the deposited silicon. The deposited silicon is then planarized to physically isolate the silicon within the gate region from the silicon within the first and second voids resulting in the formation of a transistor including a silicon gate structure and first and second source/drain structures.

7 Claims, 3 Drawing Sheets

HIGH DENSITY INTEGRATED CIRCUIT

This application is a Division of application Ser. No. 08/844,975, filed Apr. 23, 1997, now U.S. Pat. No. 5,851,883.

BACKGROUND OF THE INVENTION

1. Field of the Invention

The present invention relates to the field of semiconductor processing and more particularly to a method and structure for increasing transistor density in an integrated circuit.

2. Description of the Relevant Art

Integrated circuits are widely employed in a variety of electronics applications to produce complex electronic circuits on an extremely small area of a monolithic semiconductor substrate, such as silicon. Universally recognized for their low cost, high speed, low power dissipation, and high reliability, semiconductor integrated circuits long ago replaced discrete components as the predominant and preferred electronic devices. World-wide sales of integrated circuits have increased exponentially since the early 1960's. During this time, semiconductor manufacturers have engaged in a constant effort to reduce the cost and increase the complexity of integrated circuits by fabricating an ever larger number of transistors on a given area of semiconductor material. The predominant method of achieving greater circuit density has been the reduction of transistor geometries. Smaller transistors result in smaller and more complex devices. Small devices are desirable because of the increased number of devices manufacturable on a single semiconductor wafer and the increased probability that any individual device on a given silicon wafer will be free of random fatal defects. Since the early 1960s, when the average feature size or design rule within the industry was approximately 25 microns, the average design rule has decreased rather steadily by approximately 11% per year. The average design rule dropped below one micron in the mid 1980s, and has been decreasing steadily since that time.

In addition to the size of the transistors themselves, the amount of area required to isolate individual transistors from one another limits the transistor density, i.e., the number of transistors per unit area. Referring to FIG. 1, a conventional integrated circuit is shown in which a first transistor 10 and a second transistor 12 are fabricated on a semiconductor substrate 8. To isolate first transistor 10 from second transistor 12, an isolation structure such as shallow trench isolation structure 14 is required to prevent the inadvertent coupling of source/drain regions 16 of first transistor 10 and source/drain region 18 of second transistor 12. The lateral dimension $d_L$ of an isolation structure such as shallow trench isolation structure 14 limits the density of transistors that can be fabricated over a given area of substrate 8. As a rule of thumb, the minimum lateral dimension $d_L$ necessary to adequately ensure proper isolation between source/drain region 16 of first transistor 10 and source/drain region 18 of second transistor 12 is approximately equal to the lateral dimension $L_t$ of first transistor 10 Shallow trench isolation structure 14 occupies a region of substrate 8 that could otherwise be devoted to the formation of active transistors and represents a limitation on the achievable transistor density. It would, therefore, be highly desirable to implement a circuit design and fabrication technique to reduce or eliminate the percentage of substrate 8 occupied by isolation regions 14.

SUMMARY OF THE INVENTION

The problems identified above are in large part addressed by an integrated circuit and semiconductor process for increasing the density of transistors within the integrated circuit. By fabricating transistors on multiple levels, the present invention advantageously reduces the area required to fabricate a given number of transistors.

Broadly speaking, the present invention contemplates a semiconductor process in which a dielectric layer is formed on an upper surface of a semiconductor substrate. An upper region of the semiconductor substrate includes a silicon base layer. Thereafter, an upper silicon layer is formed on an upper surface of the dielectric layer. The dielectric layer and the upper silicon layer are then patterned to form first and second silicon-dielectric stacks on the upper surface of the base silicon layer. The patterning of the dielectric layer and the upper silicon layer exposes portions of the silicon base layer that are not covered by the silicon-dielectric stacks. The first and second silicon-dielectric stacks are laterally displaced on either side of a channel region of the silicon substrate. The silicon-dielectric stacks each include a proximal sidewall and a distal sidewall. The proximal sidewalls are approximately coincident with respective boundaries of the channel region.

A gate dielectric layer is then formed on the exposed portions of the silicon base layer. Thereafter, proximal and distal spacer structures are formed on the proximal and distal sidewalls respectively of the first and second silicon-dielectric stacks. Each of the proximal spacer structures includes an interior sidewall in contact with the proximal sidewall of the silicon-dielectric stack. Portions of the first and second silicon-dielectric stacks located over respective source/drain regions of the base silicon layer are then selectively removed. The source/drain regions are laterally displaced on either side of the channel region and extend laterally from a position approximately coincident with a lateral position of the interior sidewall of the proximal spacer structure to a lateral position intermediate between the proximal spacer structure and its corresponding distal spacer structure.

Silicon is then deposited to fill first and second voids created by the selected removal of the first and second silicon-dielectric stacks. The silicon deposition also fills a silicon gate region above the gate dielectric over the channel region. Thereafter, an impurity distribution is introduced into the deposited silicon. The deposited silicon is then planarized to physically isolate the silicon within the gate region from the silicon within the first and second voids. The planarization and physical isolation of the deposited silicon result in the formation of a silicon gate structure and first and second source/drain structures.

In one embodiment, the semiconductor substrate includes a p-type epitaxial layer formed over a p+ silicon bulk. A preferred resistivity of the p-type epitaxial layer is in the range of approximately 10 to 15 Ω-cm. In one embodiment, the semiconductor substrate includes the silicon base layer. In another embodiment the silicon base layer is separated from the semiconductor substrate by an insulating layer. The formation of the dielectric layer preferably includes depositing oxide in a chemical vapor deposition reactor chamber maintained at a temperature in the range of approximately 300° C. to 600° C. at a pressure of less than approximately two torr. The formation of the upper silicon layer is accomplished, in a preferred embodiment, by thermally decomposing silane in a chemical vapor deposition reactor chamber maintained at a temperature in the range of approximately 580° C. to 650° C. and a pressure of less than approximately two torr.

The patterning of the dielectric layer and the upper silicon layer is suitably achieved by forming a photoresist mask over the upper silicon layer such that the photoresist mask exposes portions of the upper silicon layer that are aligned over the pair of source/drain regions. The exposed portions of the upper silicon layer are then etched in a reactive ion etcher and the portions of the dielectric layer aligned over the source/drain regions are etched in a reactive ion etcher.

The formation of the gate dielectric layer is preferably achieved by thermally oxidizing exposed portions of the base silicon layer in an oxygen bearing ambient maintained at a temperature in the range of approximately 700° C. to 900° C. The formation of the proximal and distal spacer structures preferably includes depositing a spacer material over a topography including a gate dielectric and the silicon-dielectric stacks and, thereafter, anisotropically etching the spacer material to remove the spacer material from regions of the topography that are substantially planar to the upper surface of the semiconductor substrate. The deposition of the spacer material preferably includes the step of depositing silicon nitride in a chemical vapor deposition reactor chamber maintained at a temperature of approximately 300° C. to 900° C. at a pressure of less than approximately two torr.

The selective removal of the portions of the first and second silicon-dielectric stacks preferably includes the steps of patterning a photoresist mask deposited on the silicon-dielectric stacks to expose regions of the first and second silicon-dielectric stacks that are aligned over the first and second source/drain regions respectively and etching the exposed portion of the silicon-dielectric stacks with a reactive ion etcher. The etching includes a first stage during which the upper silicon layer is etched and a second stage during which the dielectric layer is etched. The deposition of the silicon to fill the first and second voids is ideally accomplished by thermally decomposing silane in a chemical vapor deposition reactor chamber maintained at a temperature in the range of approximately 580° C. to 650° C. The introduction of the impurity distribution into the deposited silicon is accomplished by implanting impurity ions into the deposited silicon. In the preferred embodiment, the impurity ions are arsenic, phosphory, or boron. Ideally, the planarization of the deposited silicon is accomplished with a chemical mechanical polish.

The present invention further contemplates a semiconductor transistor which includes a silicon base layer, a gate dielectric formed on the silicon base layer, first and second silicon source/drain structures, first and second spacer structures and a silicon gate structure. The silicon base layer includes a channel region which is laterally displaced between a pair of source/drain regions. The gate dielectric is formed on the silicon base layer over the channel region. The first and second silicon source/drain structures are formed over the first and second source/drain regions respectively. Each of the silicon source/drain structures includes an interior sidewall that is laterally coincident with a lateral position of a respective boundary of the channel region. The first and second spacer structures are formed in contact with the interior sidewalls of the first and second silicon source/drain structures respectively. The silicon gate structure is formed between the first and second spacer structures above the gate dielectric over the channel region of the silicon base layer. The silicon gate structure includes an impurity distribution.

Preferably, the gate dielectric comprises a thermal oxide of approximately 20 to 50 angstroms in thickness. In one embodiment, the first and second silicon source/drain structures each include an impurity distribution and wherein a resistivity of the first and second silicon source/drain structures is less than approximately 500 $\Omega$/square. In a presently preferred embodiment the first and second spacer structures are comprised of silicon nitride. A resistivity of the silicon gate structure is suitably less than approximately 500 $\Omega$/square.

The present invention still further contemplates an integrated circuit. The integrated circuit includes a first transistor of the type described in the preceding paragraphs and an insulating layer formed above the first transistor. A second transistor according to the transistor described in the previous paragraphs is formed on the insulating layer wherein the second transistor is vertically displaced and electrically isolated from the first transistor.

BRIEF DESCRIPTION OF THE DRAWINGS

Other objects and advantages of the invention will become apparent upon reading the following detailed description and upon reference to the accompanying drawings in which.

Figure 1:
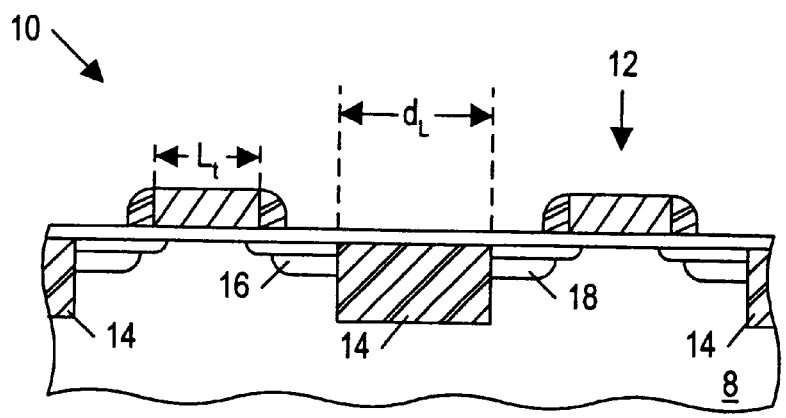
FIG. 1 is a partial cross-sectional view of a pair of semiconductor transistors separated by an isolation structure.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Figure 2:
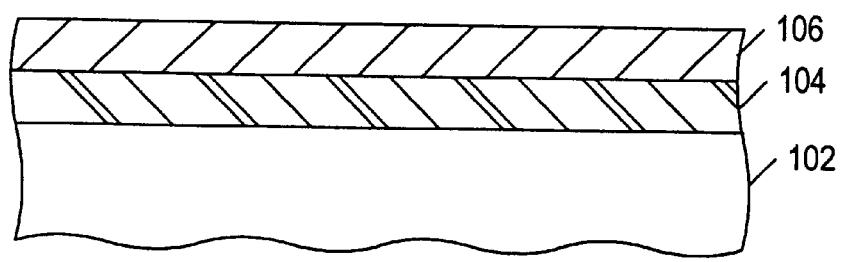
FIG. 2 is a partial cross-sectional view of a base silicon layer on which a dielectric layer and an upper silicon layer have been formed.

Turning now to the drawings, FIGS. 2 through 8 disclose a processing sequence for fabricating semiconductor transistors and integrated circuits in accordance with the present invention. FIG. 2 shows an upper silicon layer 106 formed on a dielectric layer 104 which is, in turn, formed on a base silicon layer 102. In one embodiment, the base silicon layer 102 comprises the upper portion of a semiconductor substrate. The semiconductor substrate, in a preferred embodiment useful in the fabrication of CMOS integrated circuits, includes a p-type epitaxial layer formed on a p+ silicon bulk. The preferred resistivity of the p-type epitaxial layer is in the range of approximately 10 to 15 Ω-cm. In another embodiment, the integrated circuit may include multiple levels of transistors and, accordingly, base silicon layer 102 may be formed over an insulating layer which is itself formed above the semiconductor substrate. A multiple transistor level implementation of the present invention is described in greater detail below. In an embodiment of the present invention in which base silicon layer 102 is formed over an insulating layer, base silicon layer 102 is preferably fabricated through the use of a chemical vapor deposition process in which silane is thermally decomposed in a chemical vapor deposition reactor chamber maintained at a temperature of approximately 580° C. to 650° C. and a pressure of less than approximately two torr.

Dielectric layer 104 is formed on an upper surface of base silicon layer 102. The formation of the dielectric layer 104 may be accomplished by thermally oxidizing base silicon layer 102. In a preferred embodiment, however, dielectric layer 104 is preferably fabricated by a chemical vapor deposition process in which a source such as TEOS or other appropriate oxygen bearing source is introduced into the CVD reactor chamber preferably maintained at a temperature in the range of approximately 300° C. to 600° C. and a pressure of less than approximately two torr. After the formation of dielectric layer 104 upper silicon layer 106 is deposited. In the preferred embodiment, the deposition of upper silicon layer 106 is accomplished using a silane decomposition process similar or identical to the process previously described with respect to one of the embodiments of base silicon layer 102.

Figure 3:
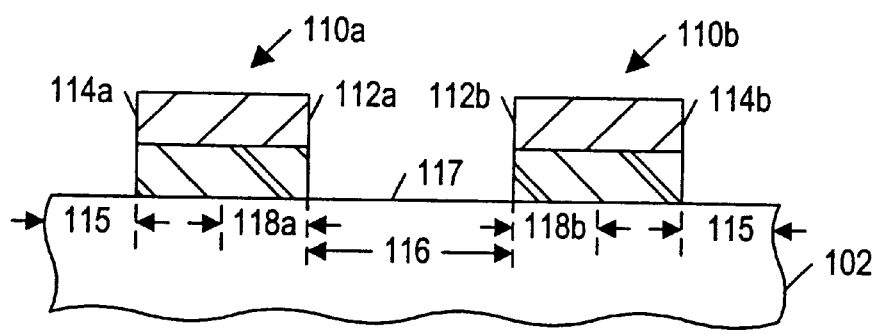
FIG. 3 is a processing step subsequent to FIG. 2 in which first and second silicon-dielectric stacks have been patterned from the dielectric layer and upper silicon layer.

Turning now to FIG. 3, a pair of silicon-dielectric stacks 110a and 110b are patterned from upper silicon layer 106 and dielectric layer 104. The patterning of first and second silicon-dielectric stacks 110a and 11b is preferably accomplished by forming a photoresist mask over upper silicon layer 106 using conventional photolithography masking techniques. The photoresist mask is formed to expose portions of upper silicon layer 106 that are aligned over a channel region 116 and field regions 115. Field regions refers to regions of base silicon layer 102 not dedicated to transistor formation and used, typically, to form isolation structures within base silicon layer 102. Thereafter, the exposed portions of upper silicon layer 106 are removed with an anisotropic etch process such as a reactive ion etch process. The anisotropic etch of selected portions of upper silicon layer 106 and dielectric layer 104 results in the formation of proximal sidewalls 112a and 112b on first and second silicon-dielectric stacks 11a and 11b respectively. Proximal sidewalls 112a and 112b are laterally aligned over respective boundaries of channel region 116. First and second source/drain regions 118a and 118b respectively are seen on either side of channel region 116 of base silicon layer 102. Each source/drain region 118 extends from a lateral position approximately defined by proximal sidewalls 112a and 112b to a position intermediate between each proximal sidewall 112 and a respective distal sidewall 114 of the silicon-dielectric stack 110. The formation of the silicon-dielectric stacks 110 exposes a portion 117 of base silicon layer 102.

Figure 4:
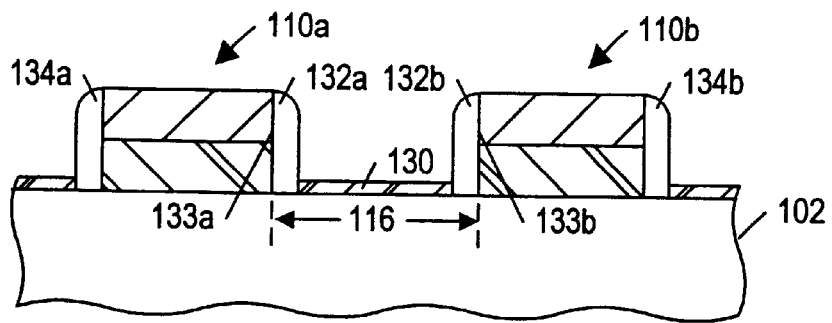
FIG. 4 is a processing step subsequent to FIG. 3 in which a gate dielectric layer has been formed on an upper surface of the base silicon layer and spacer structures have been formed on the sidewalls of the silicon-dielectric stacks.

Turning to FIG. 4, a pair of proximal sidewall structures 132a and 132b and a pair of distal spacer structures 134a and 134b are formed on respective sidewalls of the pair of silicon-dielectric stacks 110. Each proximal spacer structure 132 includes an interior sidewall 133 in contact with proximal sidewall 112 of silicon-dielectric stack 110. The fabrication of spacer structures such as proximal spacer structures 132 and distal spacer structures 134 is preferably achieved by a low pressure (i.e., less than two torr, thin film (i.e., less than 1000 angstroms in thickness) chemical vapor deposition process. Low pressure CVD processes typically result in the formation of conformal thin films upon the topography over which the film is deposited. For purposes of this disclosure, a conformal film refers to a film in which the thickness of the firm varies less than approximately 20% across the underlying topography. After the deposition of the conformal film, the spacer structures are fabricated by anisotropically etching the conformal film using an etch process with a minimal (i.e., less than 10%) overetch cycle. The anisotropic etch process will remove the conformal film in planar regions of the underlying topography and leave behind portions of the conformal film in vertical regions of the topography. For purposes of this disclosure, planar regions of a topography refer to regions of the topography that are approximately parallel with an upper surface of the underlying substrate. In a presently preferred embodiment in which it is desirable to fabricate spacer structures that are etch selective with respect to the material of upper silicon layer 106 and dielectric layer 104, spacer structures 132 and 134 are suitably comprised of silicon nitride. Conformal thin film silicon nitride is typically deposited by thermally decomposing silane and ammonia ($NH_3$) in a CVD reactor chamber maintained at a temperature in the range of approximately 300° C. to 900° C. and a pressure of less than approximately two torrs, Subsequent to the formation of spacer structures 132, any residual spacer material remaining on exposed portion 117 of base silicon layer 102 is removed by dipping the wafer into a wet solution. In embodiments wherein the spacer material is silicon nitride, an 85% phosphoric acid solution heated to approximately 120° C. is suitable as the wet solution. After removing any residual material as described, gate dielectric 130 is formed over exposed portion 117 of base silicon layer 102. In a presently preferred embodiment, gate dielectric 130 is fabricated through the use of a thermal oxidation process in which exposed portions 117 of base silicon layer 102 are immersed in an oxygen bearing ambient maintained at a temperature in the range of approximately 700° C. to 900° C. A preferred thickness of gate dielectric 130 is in the range of approximately 20 to 60 angstroms. Gate dielectric 130 is laterally aligned over channel region 116 of base silicon layer 102.

Figure 5:
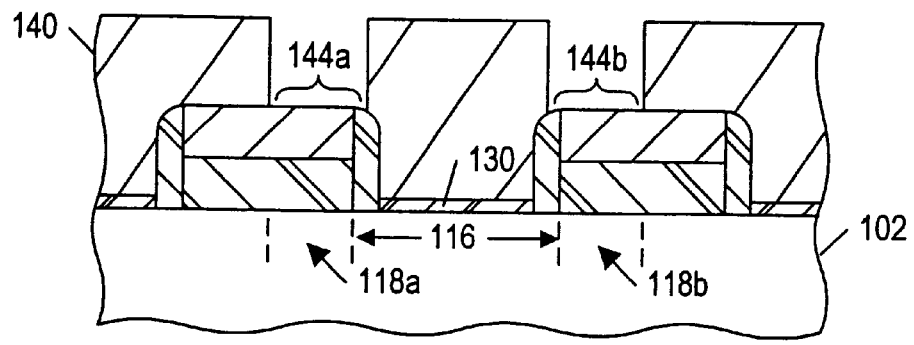
FIG. 5 is a processing step subsequent to FIG. 4 in which a photoresist mask has been patterned over the silicon-dielectric stacks to expose portions of the upper silicon layer aligned over source/drain regions of the base silicon layer.

Turning now to FIG. 5, a photoresist mask 140 is patterned to expose portions 144 of silicon-dielectric stacks 110. Exposed portions 144 of silicon-dielectric stacks 110 are laterally aligned over respective source/drain regions 118 of base silicon layer 102. As described previously, source/drain regions 118 are laterally displaced on either side of channel region 116. The patterning of photoresist layer 140 is suitably achieved with a conventional photolithography masking process.

Figure 6:
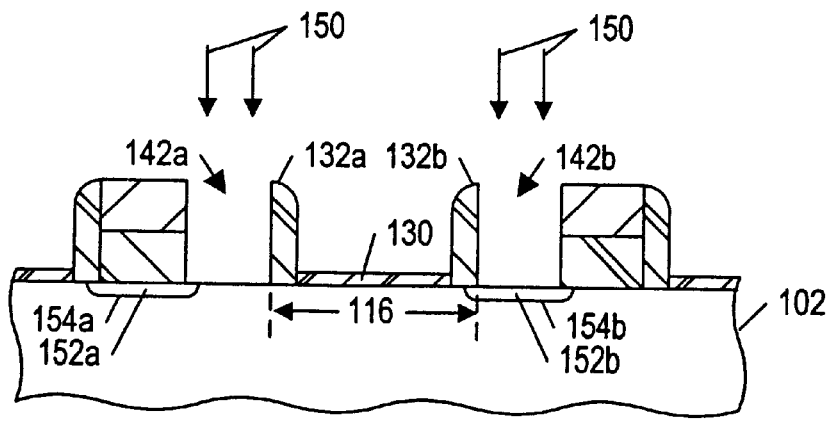
FIG. 6 is a processing step subsequent to FIG. 5 in which portions of the silicon-dielectric stacks aligned over the respective source/drain regions of the base silicon layer have been removed.

Turning to FIG. 6, portions of silicon-dielectric stacks 110a and 110b aligned over source/drain regions 118a and 118b, respectively, are removed, preferably with a two step anisotropic etch process, to create first and second source/drain voids 142a and 142b. The preferred two step etch process used to create source/drain voids 142 includes a first stage during which the silicon portion of silicon-dielectric stack 110 is removed and a second stage during which the dielectric material of silicon-dielectric stack 110 is removed. Suitable etch processes for the removal of silicon and CVD oxide include reactive ion etching using a fluorine or fluorine/chlorine bearing plasma is well known in the field of semniconductor processing. FIG. 6 shows an optional source/drain implant 150 used to introduce a source/drain impurity distribution 152 into the region bounded by source/drain boundaries 154a and 154b. The optional use of source/drain implant 150 may be desirable in certain embodiments of the present invention to introduce a shallow source/drain impurity distribution into base silicon layer 102 and to introduce some lateral encroachment of source/drain impurity distribution 152 into channel region 116 of base silicon layer 102. It is theorized that the lateral encroachment of source/drain impurity distribution 152 into channel region 116 of base silicon layer 102 may improve the speed of the integrated circuit Preferably, ion implantation 150 comprises implanting ions of boron, phosphorus, or arsenic into base silicon layer 102. In a preferred embodiment, implant 150 is carried out using an implant energy of approximately 20 to 60 keV and an implant dose in the range of approximately $10^{12}$ to $10^{14}$ atoms/cm$^2$.

Figure 7:
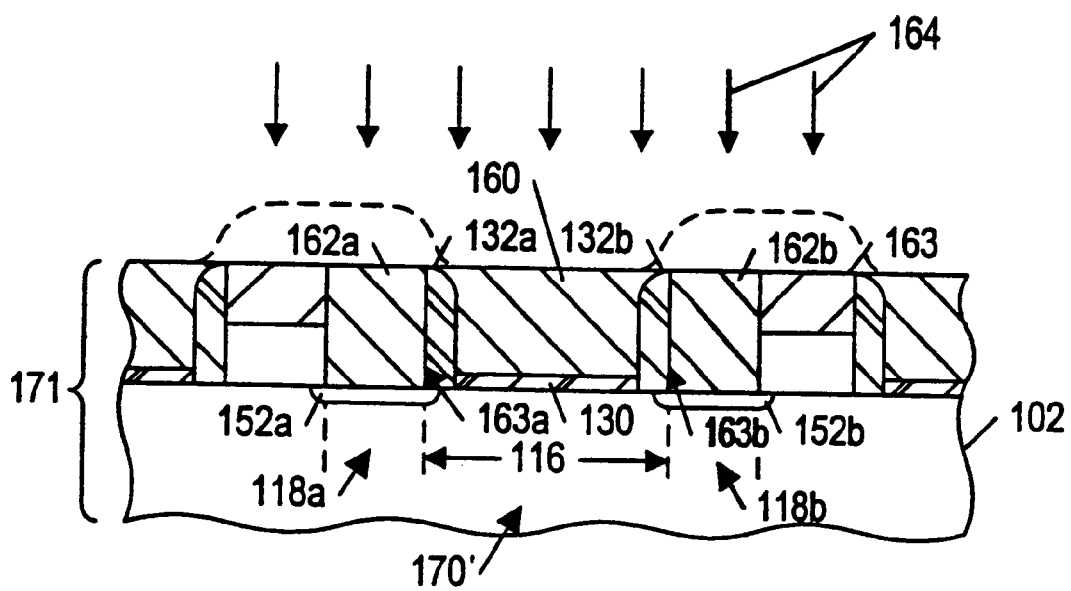
FIG. 7 is a processing step subsequent to FIG. 6 in which silicon has been deposited and planarized to form a silicon gate structure and a first and second silicon source/drain structure.

Turning now to FIG. 7, silicon gate structure 160 and a pair of silicon source/drain structures 162a and 162b are formed. In the preferred embodiment, the formation of silicon gate structure 160 and silicon source/drain structures 162 is accomplished by a CVD silicon deposition process similar or identical to the deposition of base silicon layer 102 and upper silicon layer 106 described previously, followed by a planarization process. The preferred planarization process includes a chemical mechanical polish designed to produce a substantially planar upper surface 163. Portions of the silicon removed during the preferred planarization process are shown in phantom in FIG. 7. The planarization of the deposited silicon physically isolates silicon gate structure 160 from the pair of source/drain structures 162. Subsequent or prior to the planarization process, impurities are introduced into the silicon of gate structure 160 and source/drain structures 162 through an ion implant 164. Ion implant 164 is typically carried out using an implant energy of approximately 40 to 100 keV and an implant dose in the range of approximately $10^{12}$ to $10^5$ atoms/cm$^2$. In the presently preferred embodiment, ion implant 164 is sufficient to introduce an impurity concentration into gate structure 160 and source/drain structures sufficient to reduce a resistivity of gate structure 160 and source/drain structures 162 to less than approximately 500 $\Omega$/square.

Thus, FIG. 7 shows a semiconductor transistor 170 which includes a silicon base layer 102, a gate dielectric 130, first and second silicon source/drain structures 162a and 162b respectively, first and second spacer structures 132a and 132b respectively, and a silicon gate structure 160. Silicon base layer 102 includes a channel region 116 that is laterally displaced between a pair of source/drain regions 118a and 118b. Gate dielectric layer 130 is formed on silicon base layer 102 and is laterally aligned over channel region 116. First and second silicon source/drain structures 162a and 162b are formed over first and second source/drain regions 118a and 118b respectively. Each silicon source/drain structure includes an interior sidewall 163a and 163b that is laterally coincident with a lateral position of a respective boundary of channel region 116. First and second spacer structures 132a and 132b are formed in contact with interior sidewalls 163a and 163b respectively of silicon source/drain structures 162a and 162b. Silicon gate structure 160 is formed between first and second spacer structures 132a and 132b above gate dielectric 130 such that gate structure 160 is laterally aligned above channel region 116 of silicon base layer 102. Silicon gate structure 160 includes an impurity distribution sufficient to reduce a resistivity of silicon gate structure 160 to less than approximately 500 $\Omega$/square.

As will be appreciated to those skilled in the art of semiconductor transistor operation, transistor 170 forms a conductive channel between first and second source/drain impurity distributions 152a and 152b upon an application of an appropriate bias to conductive gate structure 160. For an n-channel device, applying a positive electrostatic potential to conductive gate structure 160 induces a conductive channel of electrons immediately below gate dielectric 130 to form a conductive path between the pair of source/drain impurity distributions. In the preferred embodiment, first and second silicon source/drain structures 162a and 162b each include an impurity distribution such that a resistivity of the first and second silicon source/drain structures is less than approximately 500 $\Omega$/square. The heavily doped source/drain structures provide a plentiful source of carriers that can contribute to the conduction between source/drain impurity distributions 152a and 152b.

It will be further appreciated to those skilled in the art that transistor 170 is fabricated within a transistor level 171 which includes base silicon layer 102 and the subsequently formed upper layers of transistor 170. The present invention contemplates the fabrication of an integrated circuit including multiple, vertically displaced transistor levels.

Figure 8:
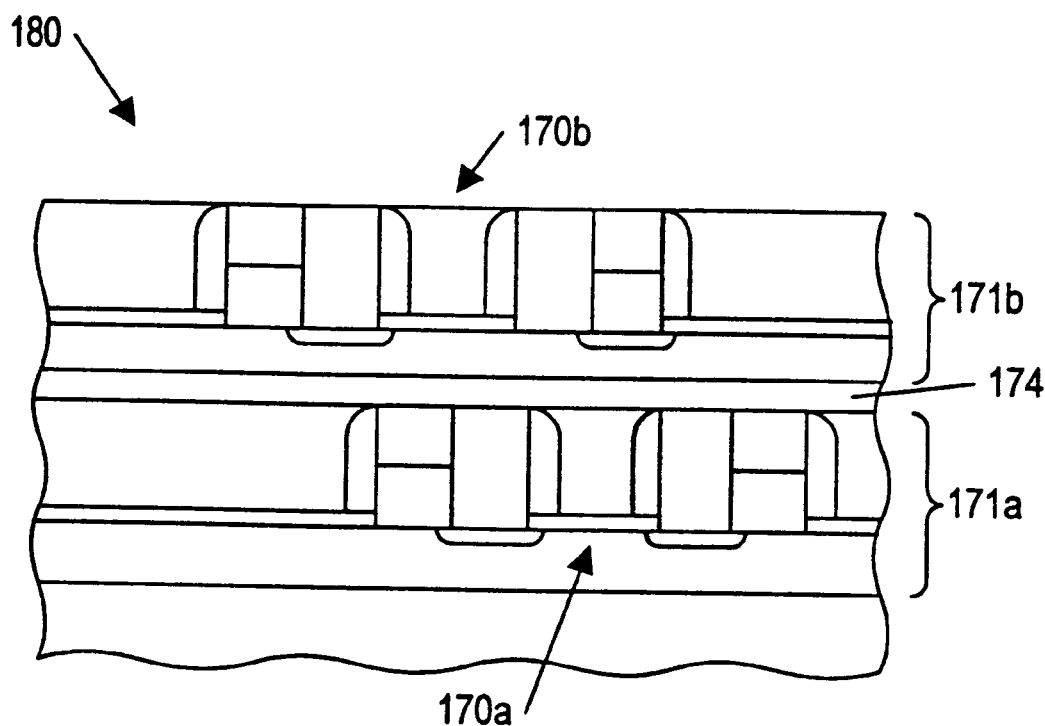
FIG. 8 is a partial cross-sectional view of an integrated circuit including a first transistor fabricated on a first transistor level and a second transistor fabricated on a second transistor level.

Turning to FIG. 8, an integrated circuit 180 is shown comprising a first transistor 170a. First transistor 170a of integrated circuit 180 is contained within a first transistor level 171a are of integrated circuit 180. First transistor 170a and first transistor level 171a are of the type described with respect to transistor 170 and transistor level 171 as shown in FIG. 7. After the formation of first transistor level 171a, an insulating layer 174 is fabricated over first transistor level 171a Insulating layer 174 may be suitably comprised of any appropriate insulating material such as a chemically vapor deposited oxide. Subsequently, a second transistor level 171b which includes a second transistor 170b is fabricated. Second transistor level 171b and second transistor 170b are fabricated in the same manner as first transistor level 171a and first transistor 170a respectively. In this manner, the present invention contemplates a multiple level integrated circuit comprising a first transistor according to the transistor described with respect to FIG. 7, an insulating layer 174 formed above the first transistor 170a, and a second transistor according to the transistor 170 of FIG. 7 formed on insulating layer 174 such that second transistor 170b is vertically displaced and electrically isolated from first transistor 170a. By vertically displacing first transistor 170a and second transistor 170b, the horizontal displacement between first and second transistors 170a and 170b may be minimized or completely eliminated thereby putting increased transistor density in integrated circuit 180. Each transistor level 171a, 171b, and so on, may contain a plurality of transistors such as first transistor 170a and second transistor 170b. By selectively introducing contact tunnels and contact structures into insulating layer 174, transistors from first transistor level 170a may be selectively coupled to transistors of second transistor level 171b.

It will be appreciated to those skilled in the art that the present invention contemplates the formation of a high transistor density integrated circuit. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. An integrated circuit comprising:
   a first silicon gate structure dielectrically spaced above a first silicon base layer and laterally between a first pair of silicon source/drain structures, wherein an upper surface of said first silicon gate structure is coplanar with upper surfaces of said first pair of silicon source/drain structures;
   a second silicon gate structure dielectrically spaced above a second silicon base layer and laterally between a second pair of silicon source/drain structures, wherein an upper surface of said second silicon gate structure is coplanar with upper surfaces of said second pair of silicon source/drain structures, and wherein said second silicon base layer is spaced above said first silicon base layer;
   a first pair of dielectric spacer structures laterally disposed between said first silicon gate structure and said first pair of silicon source/drain structures, wherein upper surfaces of said first pair of dielectric spacer structures are coplanar with said upper surfaces of said first pair of silicon source/drain structures;
   a second pair of dielectric spacer structures laterally disposed between said second silicon gate structure and said second pair of silicon source/drain structures, wherein upper surfaces of said second pair of dielectric spacer structures are coplanar with said upper surfaces of said second pair of silicon source/drain structures; and
   an insulating layer disposed above said first silicon gate structure and below said second silicon base layer, such that a lower surface of said insulating layer is adjacent an upper surface of said first silicon gate structure, and an upper surface of said insulating layer is adjacent a lower surface of said second silicon base layer.

2. The integrated circuit as recited in claim 1, wherein said first silicon base layer includes a first pair of source/drain regions arranged directly below said first pair of silicon source/drain structures.

3. The integrated circuit as recited in claim 1, wherein said second silicon base layer includes a pair of source/drain regions arranged directly below said second pair of silicon source/drain structures.

4. The integrated circuit as recited in claim 1, wherein said first pair of dielectric spacer structures and said second pair of dielectric spacer structures comprise silicon nitride.

5. The integrated circuit as recited in claim 1, wherein said insulating layer comprises oxide.

6. The integrated circuit as recited in claim 1, wherein said second pair of dielectric spacer structures are in contact with interior sidewalls of said second pair of silicon source/drain structures and with sidewalls of said second silicon gate structure.

7. The integrated circuit as recited in claim 1, wherein said second pair of dielectric spacer structures are in contact with interior sidewalls of said second pair of silicon source/drain structures and with sidewalls of said second silicon gate structure.

* * * * *

UNITED STATES PATENT AND TRADEMARK OFFICE
CERTIFICATE OF CORRECTION

PATENT NO. : 6,365,943 B1
DATED : April 2, 2002
INVENTOR(S) : Gardner et al.

It is certified that error appears in the above-identified patent and that said Letters Patent is hereby corrected as shown below:

Column 10,
Line 22, before the phrase "pair of dielectric spacer structures" please delete the word "second" and substitute therefor -- first --.

Signed and Sealed this

Twenty-fourth Day of September, 2002

Attest:

JAMES E. ROGAN
Attesting Officer
Director of the United States Patent and Trademark Office